(12) United States Patent
Ramaswami

(10) Patent No.: US 8,847,777 B2
(45) Date of Patent: Sep. 30, 2014

(54) VOLTAGE SUPPLY DROOP DETECTOR

(75) Inventor: Ravi K. Ramaswami, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 858 days.

(21) Appl. No.: 13/072,117

(22) Filed: Mar. 25, 2011

(65) Prior Publication Data

US 2012/0242490 A1    Sep. 27, 2012

(51) Int. Cl.
G08B 21/00 (2006.01)
G01R 31/30 (2006.01)
G06F 1/28 (2006.01)
G01R 31/317 (2006.01)

(52) U.S. Cl.
CPC .............. *G06F 1/28* (2013.01); *G01R 31/3004* (2013.01); *G01R 31/31725* (2013.01); *G01R 31/31701* (2013.01)
USPC ..... 340/661; 340/635; 324/750.3; 324/76.16; 324/103 R; 702/58; 702/71

(58) Field of Classification Search
USPC .................. 340/635–636.19, 661; 324/750.3, 324/764.01, 103 R, FOR. 121, 76.11, 76.13, 324/76.16; 702/58–65, 69, 71–74; 713/340; 714/1, 25, 48
See application file for complete search history.

(56) References Cited

U.S. PATENT DOCUMENTS

| | | | |
|---|---|---|---|
| 6,544,807 B1 | 4/2003 | Bach | |
| 6,933,729 B2 * | 8/2005 | Corr | ............................. 324/537 |
| 7,133,751 B2 | 11/2006 | Kurd et al. | |
| 7,138,816 B2 * | 11/2006 | Liu | ........................... 324/750.02 |
| 7,148,755 B2 | 12/2006 | Naffziger et al. | |
| 7,157,924 B2 | 1/2007 | Muhtaroglu et al. | |
| 7,212,021 B2 | 5/2007 | Karnik et | |
| 7,412,343 B2 | 8/2008 | Stroud et al. | |
| 7,646,208 B2 | 1/2010 | Ferraiolo et al. | |
| 7,650,550 B2 | 1/2010 | Ramaswami et al. | |
| 8,368,385 B2 * | 2/2013 | Barton et al. | .................. 324/133 |
| 8,497,694 B2 * | 7/2013 | Chua-Eoan et al. | ..... 324/750.15 |
| 8,593,171 B2 * | 11/2013 | Kosonocky et al. | ..... 324/764.01 |
| 2008/0203998 A1 | 8/2008 | Jenkins | |
| 2011/0074398 A1 * | 3/2011 | Barton et al. | .................. 324/133 |
| 2012/0159226 A1 * | 6/2012 | Prathaban et al. | ............ 713/340 |

* cited by examiner

*Primary Examiner* — Eric M Blount
(74) *Attorney, Agent, or Firm* — Meyertons, Hood, Kivlin, Kowert & Goetzel, P.C.

(57) ABSTRACT

A built-in self-test (BIST) circuit for detecting power supply droops is disclosed. In one embodiment, the BIST circuit includes a transition circuit configured to launch logical signals into a delay line. The BIST circuit also includes a comparator configured to compare a logic signal based on that input into the delay line with one output from the delay line. A mismatch resulting from the comparison is indicative of a power supply droop. The BIST circuit may also include circuitry for calibrating the delay line. The calibration may be performed by enabling a feedback path between the output of the delay line and its input. Enabling the feedback path may form a ring oscillator utilizing the delay line. A counter may count the number of transitions caused by the ring oscillator in a predetermined time. The resulting count may be used to determine if the delay is in a desired range.

24 Claims, 6 Drawing Sheets

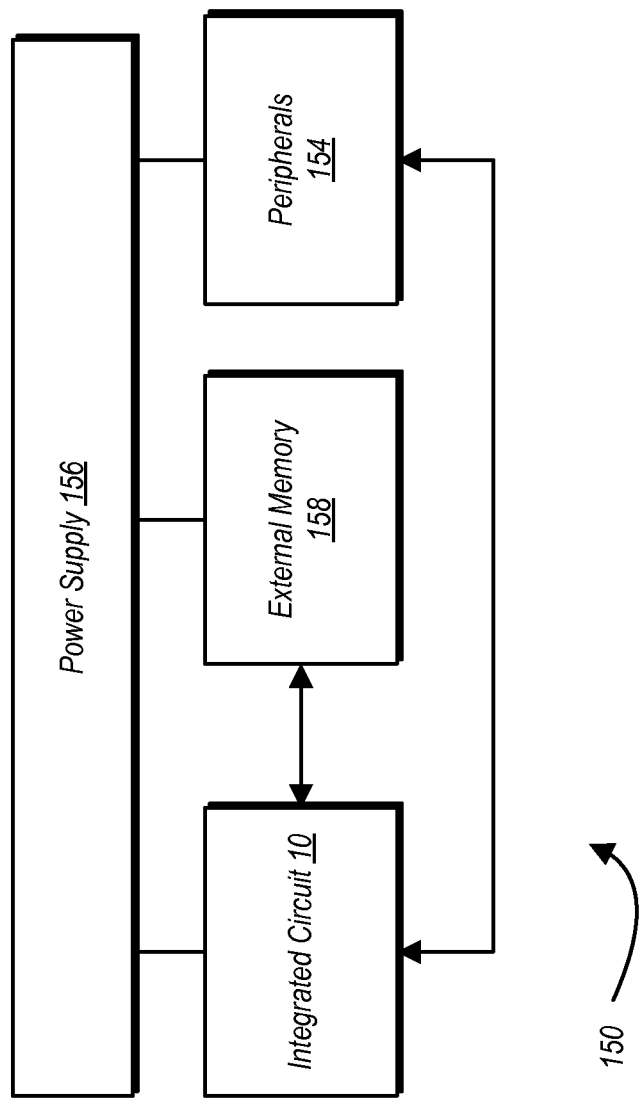

VOLTAGE SUPPLY DROOP DETECTOR

BACKGROUND

1. Field of the Invention

This invention relates to electronic circuits, and more particularly, to circuitry for detecting power supply droops.

2. Description of the Related Art

Integrated circuits (ICs) typically receive power from one or more external power supplies. Many modern ICs include multiple power domains, each of which may be powered by a different external power supply with respect to the others. The different power domains may operate at different supply voltages.

During operation, an IC may at time undergo a power supply 'droop'. A droop may be defined as a temporary drop in the supply voltage for a given power domain. Droops may be caused by one or more of another different factors, such as the simultaneous switching of a number of circuits, temperature variations, process variations, and so forth. Circuitry subject to a power supply droop may experience erroneous operation (e.g., timing failures) as a result thereof. Failures resulting from power supply droop may be considered soft failures, since they are not always repeatable in the absence of the drop in the supply voltage. Accordingly, determining the cause and characterizing such failures may be difficult.

SUMMARY

A power supply droop detector is disclosed. In one embodiment, a power supply droop detector includes a delay unit having a number of delay elements. A transition circuit is arranged to serially launch logical transitions (e.g., a logic 1, followed by a logic 0, followed by a logic 1, and so forth) into the delay unit. The data output by the delay unit may be compared to data corresponding to the logical transition launched by the transition circuit. A mismatch may indicate the occurrence of a droop in the supply voltage provided to the droop detector, and thus to the power domain in which it is implemented. A mismatch may occur due to a voltage droop since the lower supply voltage may slow the switching time of the delay elements in the delay line, thus affecting the timing of the signals received by a comparison circuit. An occurrence of a mismatch that lasts for only a single clock cycle may indicate a transient voltage droop (e.g., due to simultaneous switching, etc.). A number of consecutive mismatches may be indicative of another cause, such as a high temperature of the integrated circuit (IC) die in at least that particular region.

During a system startup, a calibration routine may be performed on the power supply droop detector. Control logic may inhibit the transition circuit, while enabling a feedback path coupled between an output of the delay unit and an input of the delay unit. The delay unit may be implemented using an odd number of inverting delay elements. Thus, when the feedback path is enabled, a ring oscillator is formed. During the calibration routine, the ring oscillator may be allowed to cycle for a predetermined time. The transitions caused by the ring oscillator may be counted by a counter coupled to the feedback path. After the predetermined time has elapsed, the counting may be halted, with the count being compared to a value indicative of a desired delay of the delay unit. If the count is within a specified range of values at or near the desired delay, the calibration routine may be considered complete. If the count is not within the specified range, the delay provided by the delay unit may be adjusted (e.g., by selecting a different number of delay elements) and repeating the process of cycling the ring oscillator and counting the number of transitions during the predetermined time.

BRIEF DESCRIPTION OF THE DRAWINGS

The following detailed description makes reference to the accompanying drawings, which are now briefly described.

FIG. 6 is a block diagram of one embodiment of a system.

Figure 1:
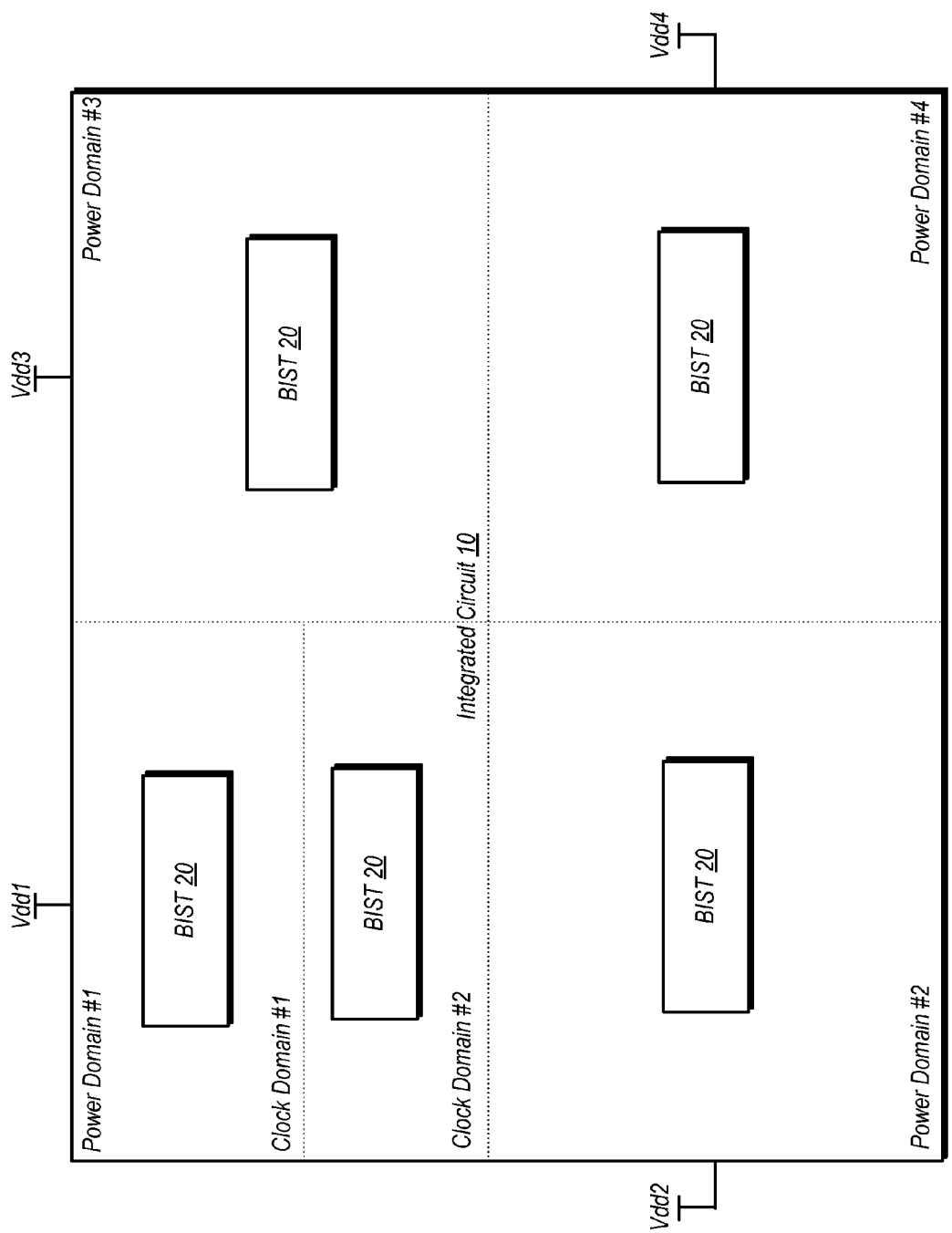
FIG. 1 is a block diagram of one embodiment of an integrated circuit (IC) having a plurality of power domains.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit (IC) and Droop Detection Circuit:

Turning now to FIG. 1, a block diagram of IC having a number of different power domains is shown. IC 10 in the embodiment shown includes four different power domains. Each of the power domains is coupled to receive a supply voltage (e.g., Power Domain #1 is coupled to receive Vdd1, etc.). In some cases, one or more of these supply voltages may be different from the others, and embodiments wherein each supply voltage is unique with respect to the others are possible and contemplated. In addition, power domain #1 in this example is divided into two different clock domains.

Although not explicitly shown, each power domain may include various circuits (which may be analog, digital, or mixed signal) that are configured to operate utilizing the received supply voltage. Furthermore, although not shown here, IC 10 may be divided into a number of different clock domains, which various circuits therein operating according to different clock signals (e.g., of different frequencies).

Each power domain in the embodiment shown also includes a built-in self-test (BIST) circuit 20, with power domain #1 including two BIST circuits 20 (one for each of the two clock domains therein). Each BIST circuit 20 in the embodiment shown is configured to detect supply voltage droops. A supply voltage droop may be defined as a drop in the supply voltage extends beyond a specified tolerance. For example, if a supply voltage is 1.0 volt with a tolerance of ±5% (i.e., ±0.05 volts), a drop in the supply voltage of 0.1 volt may be considered a voltage droop. Such voltage droops may occur due to a variety of causes, such as the simultaneous or concurrent switching of a large number of circuits, temperature variations, and so forth. Some of these voltage droops may be very brief (e.g., no more than a single clock cycle), while others may last for a number of clock cycles. Each BIST circuit 20 may be configured to detect voltage droops that for a duration that is as small as being less than a full clock cycle as well as those lasting for a number of clock cycles.

Figure 2:
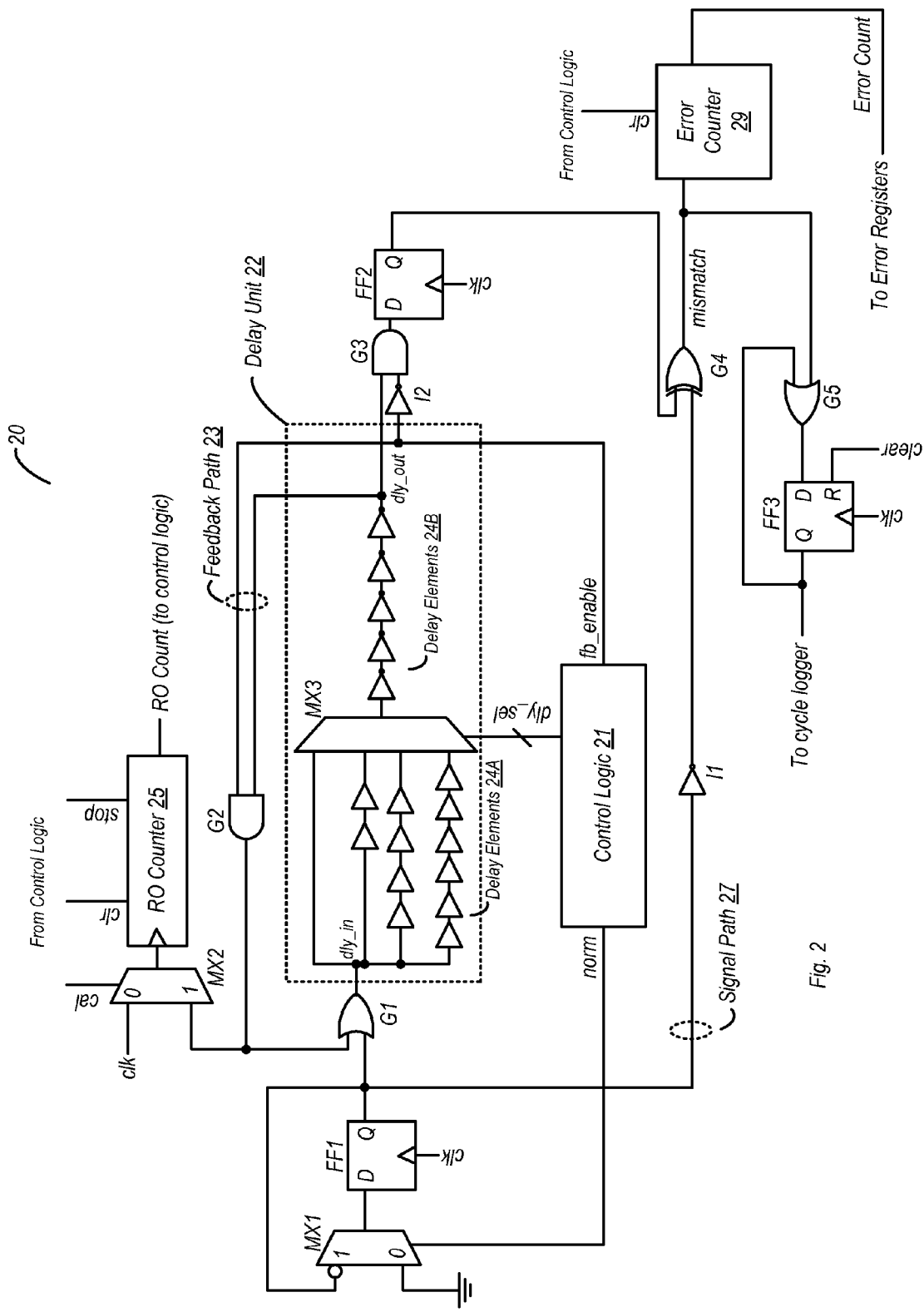
FIG. 2 is a diagram of one embodiment of a built-in self-test (BIST) circuit configured to detect voltage droops.

FIG. 2 is a diagram illustrating one embodiment of BIST circuit 20. In the embodiment shown, BIST circuit 20 includes a delay unit 22 which may provide the basis for detecting whether or not a supply voltage droop has occurred. A supply voltage droop in a power domain in which BIST circuit 20 is implemented may slow the switching times of devices in that domain, and may thus increase the delay provided by delay unit 22. This increase in delay resulting from a voltage droop may be detected by a comparator circuit, as will be discussed in further detail below.

Delay unit 22 includes a number of delay elements 24A and 24B between its input (at 'dly_in') and its output (at 'dly_out'), and a multiplexer MX3, which can be used to select a specific number of delay elements (and thus adjust the delay). Delay elements 24A to the left of MX3 are implemented as non-inverting buffers in this embodiment. Delay elements 24B to the right of MX3 in this embodiment are implemented as inverters. Each inverter may be implemented using a PMOS pull-up transistor and an NMOS pull-down transistor. Each buffer may be implemented as two serially coupled inverters.

Multiplexer MX 3 in the embodiment shown is configured to select as an input a path that includes a number of delay elements 24A. The particular path to be provided as the active input to MX3 may be selected by control logic 21. In the embodiment shown, control logic 21 is coupled to provide selection signals on the signal path 'dly_sel'. Based on the selection signals provided, one of the paths is selected and may thus provide a signal to the output of MX3. An odd number of inverting delay elements 24B is coupled to the output of MX3. Accordingly, the total number of delay elements through delay unit 22 is an odd integer value, regardless of the path selected as an input to MX3.

It is noted that the exact number of elements and increments thereof may vary from one embodiment to the next. Furthermore, while the embodiment of delay unit 22 shown here is inverting (e.g., having an odd number of inverting delay elements in any selected path), non-inverting embodiments are possible and contemplated. It is further noted that the topology of delay unit 22 in the embodiment shown is exemplary. In general, any topology may be utilized wherein the number of delay elements between an input and an output are may be changed.

BIST circuit 20 in the embodiment shown includes a calibration unit that is implemented by feedback path 23, multiplexer MX2, and ring oscillator (RO) counter 25. The feedback path 23 includes AND gate G2, which includes a first input coupled to the output of delay unit 22, and a second input coupled to receive the 'fb_enable' signal from control logic 21. To enter a calibration mode, control logic 21 may assert the 'fb_enable' signal to enable feedback path 23 and the 'cal' signal to couple feedback path 23 to RO counter 25. The 'norm' signal may be de-asserted when entering the calibration mode, causing flip-flop FF1 to provide a logic 0 on its Q output. In one embodiment, the calibration mode may be entered during a system startup routine, and exited once the system startup routine is complete.

Since the number of inverting delay elements 24B through any selected path of delay element 22 is odd (due to the odd number of elements coupled to the output of MX3), enabling feedback path 23 effectively forms a ring oscillator. When fb_enable is asserted, the output of G2 is dependent upon the output on the dly_out node. Therefore, when fb_enable is asserted, the logic level on dly_out is propagated to dly_in, through OR gate G1 in this embodiment. The odd number of inverting delay elements 24B in the path of delay unit 22 thus causes logical transitions to occur on both its output and input.

It is noted that embodiments are possible and contemplated wherein all of the delay elements in delay unit 22 are non-inverting. In such an embodiment, one or more inverting elements or logic gates (e.g., implementing G2 as a NAND gate) may be placed in the feedback path to form a ring oscillator. Embodiments are also possible and contemplated wherein all delay elements of delay unit 22 are implemented as inverting elements. In any case, formation of the ring oscillator by enabling feedback path 23 may include a signal path having an odd number of inverters.

During operation in the calibration mode, the logical transitions generated by the ring oscillator formed when feedback path 23 is enabled are provided as a clock signal to RO counter 25. Control logic 21 may hold RO counter 25 in a reset state by asserting the 'clr' signals until ready to calibrate delay unit 22. When the ring oscillator formed by enabling feedback path 23 is cycling (i.e. causing logical transitions), control logic 21 may release RO counter 25 from its reset state by de-asserting the 'clr' signal. RO counter 25 may then begin counting the logical transitions. After a predetermined time has elapsed, control logic 21 may assert the 'stop' signal to RO counter 25, which may respond by halting the count. The count may then be provided to control logic 21 via the 'RO count' output. The count may be provided as a digital value. Control logic 21 may compare the count received from RO counter 25 to an expected count representative of the desired delay. In some embodiments, only the most significant bits of the count may be compared to their counterparts of the expected count, thereby allowing some variation of the delay within a range represented by the least significant bits.

When the comparison of the most significant bits of the count match the most significant bits of the expected value, the delay provided by delay unit 22 may be considered to be within a specified range. Responsive to making such a determination, control logic 21 may de-assert the 'fb_enable' and 'cal' signals, while asserting the 'norm' signal.

If the comparison of the most significant bits of the count does not match that of the expected value, the calibration routine may continue. Responsive to making such a determination, control logic 21 may cause the number of active delay elements 24A in delay unit 22 to change. This may be accomplished by changing the state of the 'dly_sel' signals. Changing the state of these signals may change the path selected as the active input to multiplexer MX3. This in turn may change the overall number of elements, including delay elements 24A and 24B, in the path between the input and output of delay unit 22. The number of active delay elements 24A may be increased if the count is less than the desired value (or less than the minimum value of the specified range) or decreased if the count is greater than the desired value (or greater than the maximum value of the specified range). After changing the number of active delay elements 24A, control logic 21 may de-assert the 'stop' signal and temporarily assert the 'clr' signal provided to RO counter 25. Asserting the 'clr' signal may reset RO counter 25, after which the counting process may begin again, with control logic 21 asserting the 'stop' signal once the predetermined time (from the beginning of counting) has elapsed. The process may repeat itself for a number of iterations until the count value is within the specified range (and thus the delay is within its specified range).

Once the calibration of delay unit 22 is complete, operation of BIST circuit 20 in the normal mode may commence. Operation in the normal mode may be initiated by control logic 21 by asserting the 'norm' signal, while de-asserting the 'cal' signal (provided to MX2) and the 'fb_enable' signal provided to AND gate G2 (to disable feedback path 23). When the 'norm' signal is asserted, the inverting input of MX1 is selected. In the embodiment shown, the inverting input of MX1 is coupled to the output of flip-flop FF1. Accordingly, with each new clock cycle, FF1 will load, through its 'D' input, a logical state that is opposite of that which was loaded on the immediately preceding clock cycle. Similarly, FF1 in this arrangement outputs a signal having a logical state that is opposite that which was output by FF1 on the immediately preceding clock cycle. Thus, when operating in the normal mode, FF1 functions as a transition circuit that launches logical transitions into delay unit 22. In this particular embodiment, the logical transitions are conveyed to the input of delay unit 22, 'dly_in', through OR gate G1.

The logical transitions launched by FF1 may be conveyed through delay unit 22 to its output, 'dly_out'. The output of delay unit 22 in the embodiment shown is provided as an input to AND gate G3, with the output of inverter 12 provided as the other input. When in the normal mode, 'fb_enable' (input to 12) is not asserted, and thus 12 outputs a logic 1 to its respective input of G3. Thus, when operating in the normal mode, the output from G3 follows the logic value present on the output of delay unit 22. Since delay unit 22 is configured to provide a delay path having an odd number of inverting elements in this example, the logic value received as an input results in a complement being provided on its output.

The logical signal output from delay unit 22 through G3 may be received by flip-flop FF2 in the embodiment shown. The 'Q' output from FF2 may be provided as an input to a comparator unit, which is implemented at exclusive OR (XOR) gate G4 in this embodiment. The other input to G4 in the illustrated embodiment is provided from the output of inverter I1 on signal path 27. Signal path 27 is coupled to receive the logical value that is output from FF1, which is also the logical value input into delay unit 22. Since delay unit 22 is an inverting delay unit, signal path 27 also includes inverter I1 to generate the complement of the signal output by FF1.

If the signals received by G4 are not logically equivalent (e.g., one is a logic 1, the other is a logic 0), the 'mismatch' signal may be asserted. Assertion of the 'mismatch' signal may indicate that the supply voltage is no longer within its specified tolerance. When the supply voltage is not within its specified tolerance, the timing of a signal propagating through delay unit 22 may be affected. For example, if the supply voltage received by delay elements 24A and 24B is lower than its specified minimum value, additional delay may be introduced into delay unit 22. Accordingly, a signal propagating along signal path 27 in the illustrated embodiment may arrive at its respective input of G4 prior to the arrival of the signal output by FF2. If the timing of the signals arriving at the inputs of G4 differs sufficiently (e.g., by one clock cycle), the signals evaluated during a given cycle may logical complements of one another. In such a case, G4 may indicate a mismatch.

In some cases, a droop in the supply voltage may cause a mismatch for as little as a single clock cycle. In such a case, the most likely cause of the supply voltage droop may be a transient event. Such transient events may include the simultaneous switching of a large number of circuits in the IC in which BIST circuit 20 is implemented, an electromagnetic interference (EMI) event, or other cause. In other cases, the droop in the supply voltage may cause mismatches to be indicated for several consecutive clock cycles. A number of consecutive mismatches may be indicative of a supply voltage droop caused by a high temperature (and possibly thermal overstress) on the IC. Such thermal overstress may increase the delay provided by the delay elements 24A and 24B of delay unit 22.

In the embodiment shown, G4 is coupled to provide the mismatch signal to error counter 29. Error counter 29 may be used to track a count of mismatches detected by G4. In some cases, if two consecutive clock cycles do not produce mismatches (e.g., as a result of a supply voltage droop from a transient event), control logic 21 may assert the 'clr' signal provided to error counter 29 in order to perform a reset. However, if mismatches are indicated on two or more consecutive clock cycles, error counter 29 may be permitted to continue incrementing. The error count may be provided from error counter 29 to error registers or other circuitry not explicitly shown here. These registers or other circuitry may be periodically interrogated by software or other mechanisms to obtain information for analyzing the cause of the errors and to provide a basis for corrective action to be taken.

BIST circuit 20 may also include 'sticky bit' circuitry, which is implemented by FF3 and OR gate G5 in this embodiment. An asserted 'mismatch' signal output by XOR gate G4 may be propagated through OR gate G5 and thus captured by FF3 via its 'D' input. For subsequent clock cycles, the 'Q' output of FF3 is fed back to its 'D' input via OR gate G5. Accordingly, a captured logic 1 resulting from assertion of the 'mismatch' signal by XOR gate G4 may be held by FF3 until the 'clear' signal is asserted on its 'R' (Reset') input. The output of FF3 may be provided to a cycle logger or other circuitry that may log the clock cycle on which the 'mismatch' signal was first asserted.

Figure 3:
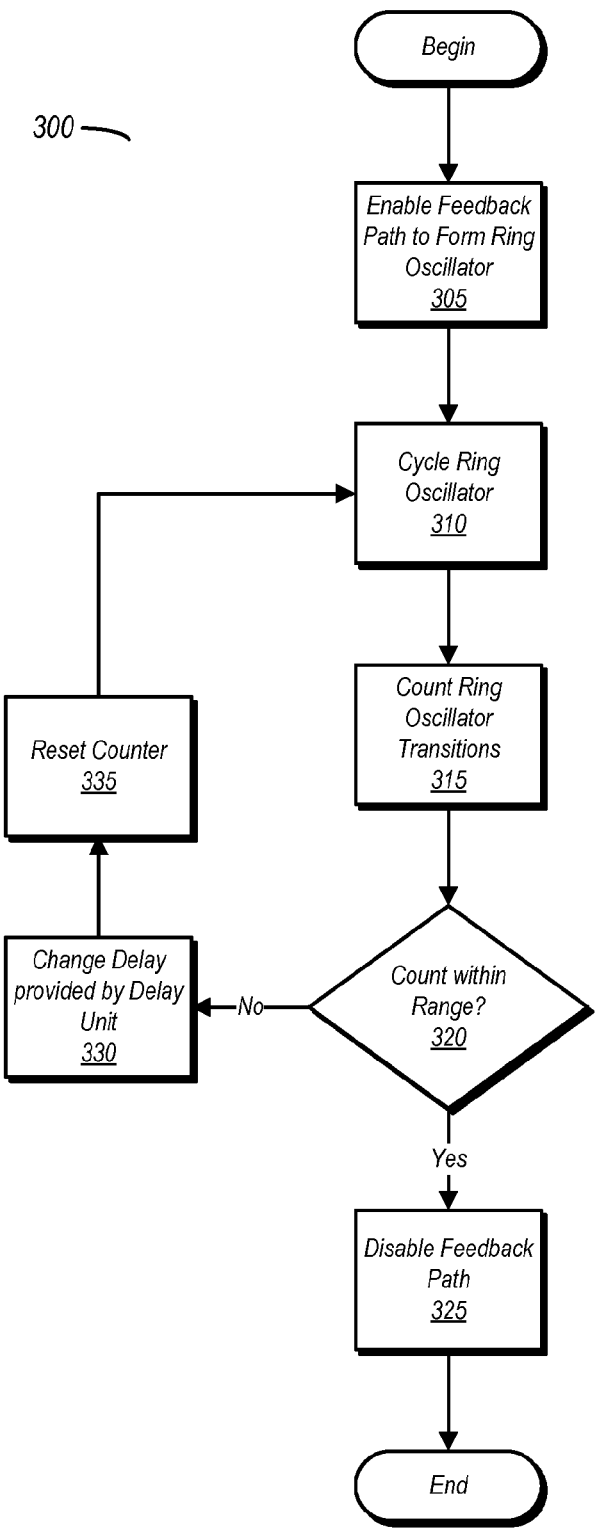
FIG. 3 is a flow diagram of one embodiment of a method for calibrating a delay line in a BIST circuit.

Calibration Methodology:

FIG. 3 is a flow diagram of one embodiment of a method for calibrating a delay line in a BIST circuit. Method 300 as illustrated in FIG. 3 may be implemented by an embodiment of BIST circuit 20 of FIG. 2, but is also contemplated as being implemented by other embodiments of a BIST circuit as well.

Method 300 begins with the enabling of a feedback path to form a ring oscillator (block 305). The feedback path may be coupled between an output and an input of a delay unit. Signals may be received into the feedback path from the output of the delay unit, and may be provided to the input of the delay unit. In embodiments such as that illustrated in FIG. 2, the delay unit may include an odd number of inverting delay elements. Thus, the feedback path need not provide any inverting elements of its own to form a ring oscillator with the delay unit. However, embodiments are also possible and contemplated wherein the delay unit may include an even number of inverting delay elements, and wherein the feedback path provides at least one inverting delay element to produce an overall odd number of inverting elements to form a ring oscillator.

After the feedback path is enabled and the ring oscillator is formed, the ring oscillator may be cycled (block 310). When cycled, the ring oscillator may produce logical transitions such that it effectively produces a clock signal. The feedback path may be coupled to a counter, and thus the transitions produced by the ring oscillator may be counted (block 315). The counting of transitions produced by the ring oscillator may occur for a predetermined time. After the predetermined time has elapsed, the counting of transitions may be halted, with the counter providing the final count value as an output. The final count value obtained during the predetermined time may correspond to an amount of delay provided by the delay unit. In general, the amount of delay provided may be inversely proportional to the final count value.

The count value produced during the cycling of the ring oscillator may be compared to an expected value to determine if the count, and thus the delay, is within a desired range (block 320). In one embodiment, the count value and the expected value may each be represented by a digital value having an equal number of bits. The comparison operation may compare a certain number of most significant bits of the count value to the expected value. For example, if the count value and the expected value are both represented by a six-bit digital number, the four most significant bits may be compared to one another. Thus, the count value produced by the counter during the cycling of the ring oscillator may be allowed to vary within a specified range represented by the possible variation in the least significant bits. Correspondingly, the delay provided by the delay unit may also be allowed to vary within a specified range.

If the comparison of the most significant bits of the count value and the expected value do not match, the count value and the corresponding delay are not within their respective specified ranges. Accordingly, when the count is not within its specified range (block 320, no), a control unit may adjust the amount of delay provided by the delay unit (block 330). The adjustment of the amount of delay may be accomplished by activating additional delay elements in the delay path (if the corresponding delay is too low) or deactivating delay elements in the delay path (if the corresponding delay is too high). After the delay has been adjusted, the control unit may cause the counter to be reset (block 335), and another iteration of calibration may commence by cycling the ring oscillator and repeating the counting and comparison operations.

If the most significant bits of the count value and the expected count are equal, the count (and thus the delay) may be considered to be within its specified range (block 320, yes). Accordingly, the feedback path may be disabled (block 325), and the calibration process may be considered complete.

Figure 4:
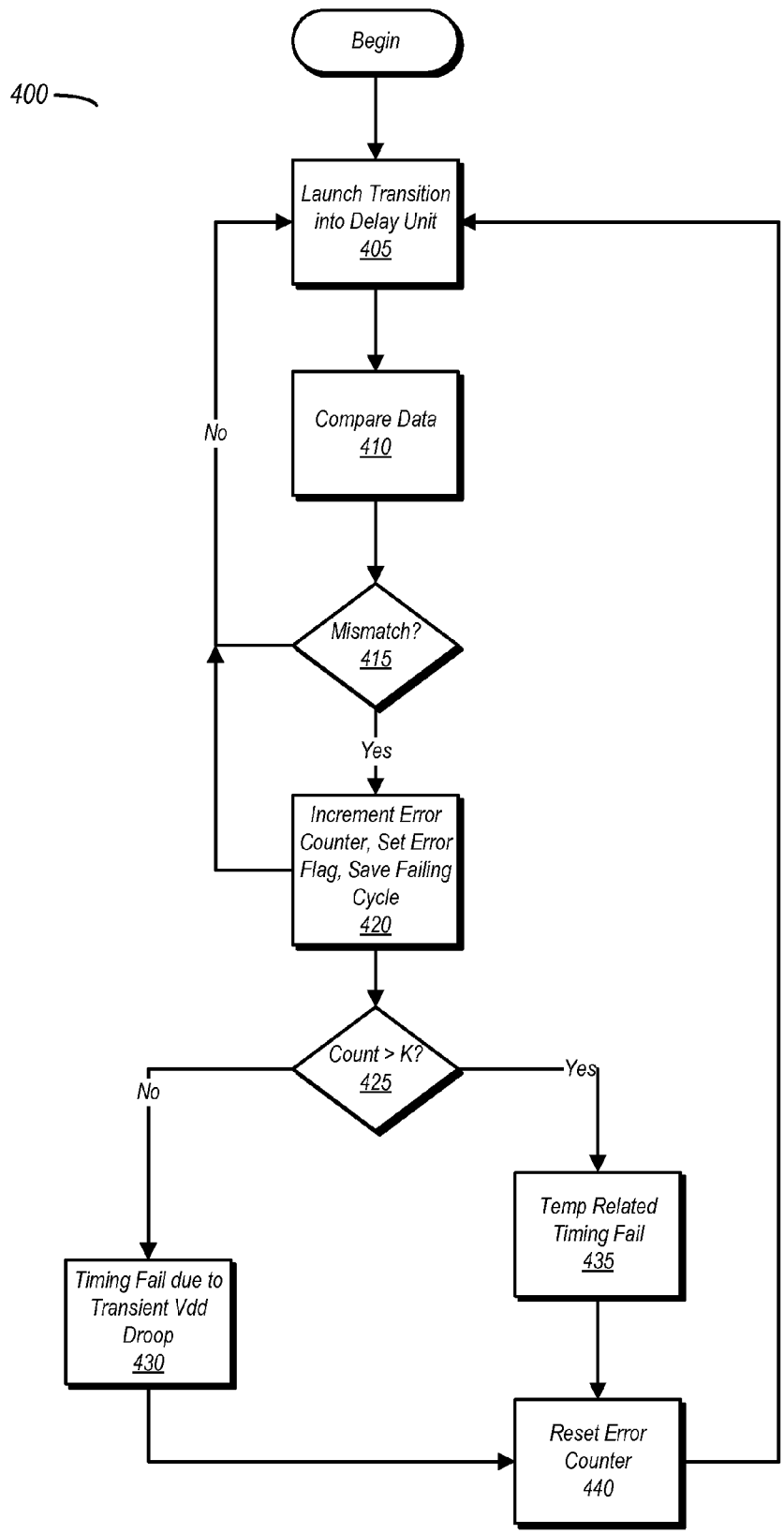
FIG. 4 is a flow diagram of one embodiment of a method for using a BIST circuit to detect voltage droops.

Voltage Supply Droop Detection Methodology:

FIG. 4 is a flow diagram of one embodiment of a method for using a BIST circuit to detect voltage droops. Method 400 as illustrated in FIG. 4 may be implemented by an embodiment of BIST circuit 20 of FIG. 2, but is also contemplated as being implemented by other embodiments of a BIST circuit as well.

Method 400 in the embodiment shown begins with the launching of a logical transition into a delay unit (block 405). The launching of transitions may be accomplished by a transition unit configured to provide logical transitions on successive clock cycles. For example, the transition unit may provide a logic 1 to the delay unit on a first clock cycle, a logic 0 on a second clock cycle, a logic 1 on a third clock cycle, and so on.

The transitions launched into the delay unit may also be launched into a signal path separate from the delay unit. This signal path may provide a first input into a comparator unit, while the output of the delay unit may be received as a second unit (via G3 and FF2 in the embodiment shown in FIG. 2). The signal path may be arranged such that its propagation delay is approximately the same as that of the delay unit when calibrated and operating within its specified range. The comparator unit may compare the signal received by the signal path and the signal received from the output of the delay unit (block 410). If the two signals have the same logic value (e.g., logic 1), then no mismatch is indicated (block 415, no). Matching logic values of the two signals may indicate that the timing of the circuitry is within specifications, and thus no supply voltage droop or other cause of excess delay has been introduced into the path of the delay unit.

If the two signals compared do not match in logic value (block 415, yes), then a mismatch may be indicated. Indication of the mismatch may in turn cause the incrementing of an error counter, the setting of an error flag, and the saving of information indicative of the failing cycle (block 420). The method may return to block 405, and the process of launching transitions, comparing data, and determining whether or not mismatches occur may continue. In addition, an examination of the count over consecutive cycles of comparing may aid in determining the cause of the mismatch. If a mismatch occurs on a first clock cycle but not on a second cycle immediately succeeding the first, then the counter will not exceed a value of one on the latter. More generally, the count may be compared to a designated value of K (e.g., K=1 in one embodiment). Accordingly, a count not greater than the value K (block 425, no), for one or more cycles immediately succeeding the cycle which produced the mismatch may be indicative of a timing failure due to a transient supply voltage droop (block 430). Since such a failure may be transient in nature (and thus confined to a single cycle or just a few cycles), the error counter may be reset (block 440). However, mismatches occurring for a number of consecutive cycles may indicate another source of a timing failure, such as temperature (block 435). Since the temperature resulting from thermal stress may show only a small (if any) variation between consecutive clock cycles, the resulting timing failure may also be present for a number of consecutive clock cycles. Accordingly, the error counter may be allowed to continue incrementing until the failure is clear as indicated by the mismatches ceasing to occur. The final count value may be forwarded to an error register or other circuitry, while the error counter may be reset (block 440) once the failure has cleared.

Figure 5:
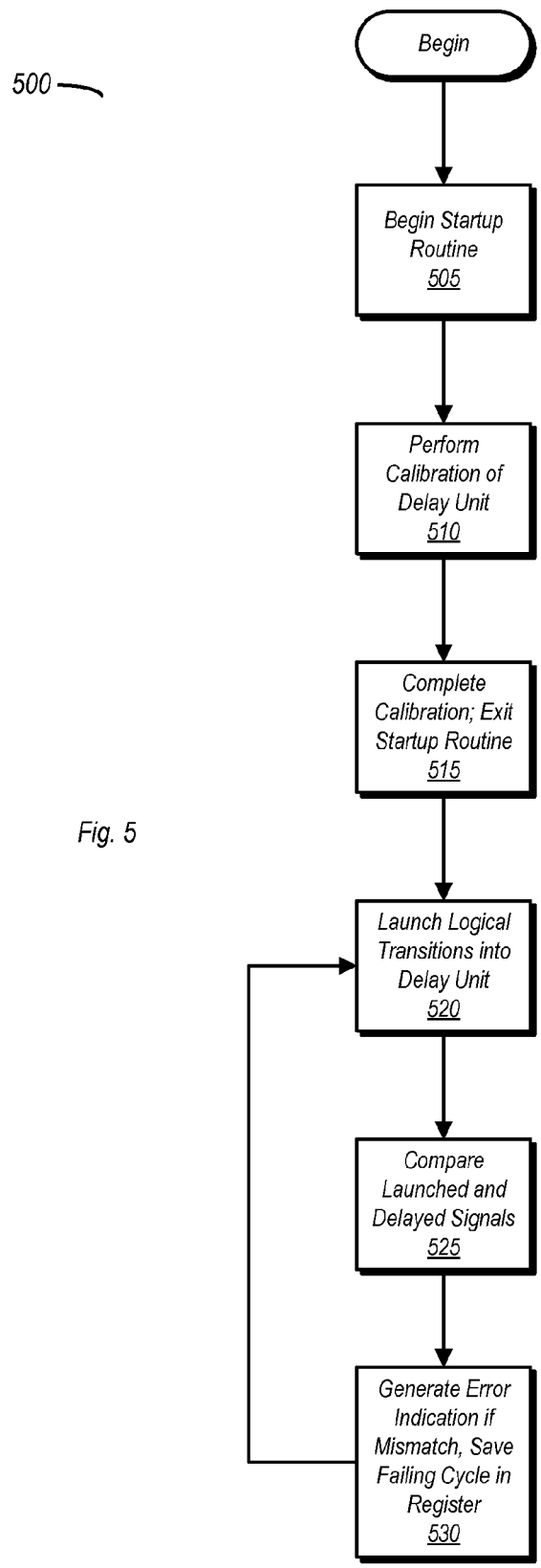
FIG. 5 is a flow diagram of one embodiment of a method for performing a startup of an IC an entry into a normal mode of operation.

Methodology for System Startup and Entry into Normal Mode:

FIG. 5 is a flow diagram of one embodiment of a method for performing a startup of an IC and entry into a normal mode of operation. Method 500 as illustrated in FIG. 6 may be implemented by the embodiment if IC 10 of FIG. 1 including the BIST circuit 20 of FIG. 2, but is also contemplated as being implemented by other embodiments of an IC and BIST circuit as well.

Method 500 begins with the execution of a startup routine (block 505). The startup routine may begin when power is applied to an IC that includes a BIST circuit configured to detect supply voltage droops using a delay unit. During the startup routine, a calibration of the delay unit may be performed (block 510). In one embodiment, the calibration may be performed in accordance with the methodology described above with reference to FIG. 3. The calibration routine may be performed with an objective of setting the delay provided by the delay unit to a known value or within a specified range of delay values.

Once the delay provided by the delay unit is within the specified range, the calibration may be considered complete, and the startup routine may be exited thereafter (block 515). In some cases, the calibration routine may be complete before the startup routine is complete. In such instances, control logic may cause the BIST circuit to exit a calibration mode, but may prevent it from entering a normal mode until the remainder of the startup routine is complete.

Once the startup routine has been exited, the BIST circuit may be placed in a normal mode of operation, upon which it may begin launching logical transitions into the delay unit (block 520). The launched signals may be conveyed into a separate signal path as well as into the delay unit. Corresponding signals output from the delay unit and conveyed on the separate signal path may be compared to one another (block 525). If the comparison indicates that the two signals have different logical states, an error indication may be generated (block 530). The method may repeat from block 520 through block 530. As discussed above, the indication of a mismatch may indicate the occurrence of a timing failure due to a supply voltage droop. A single, non-repeated mismatch may indicate that the supply voltage droop is the result of a transient event. A repeated occurrence of a mismatch (over several consecutive clock cycles) may indicate that the supply voltage droop that is caused by a non-transient event.

Exemplary System:

Turning next to FIG. 6, a block diagram of one embodiment of a system 150 is shown. In the illustrated embodiment, the system 150 includes at least one instance of an IC 10 (from FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMM5), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a delay unit coupled to receive a signal and configured to output a delayed complement of the signal;
   a calibration unit configured to, when operating in a first mode, determine an amount of delay provided by the delay unit;
   a comparison unit coupled to receive the signal and the delayed complement of the signal, wherein the comparison unit is configured to, when operating in a second mode, compare a complement of the signal to the delayed complement of the signal, and wherein the comparison unit is further configured to generate an error indication if a logic level of the complement of the signal does not match a logic level of the delayed complement of the signal; and
   a control unit configured to enable the calibration unit when operating in the first mode and further configured to disable the calibration unit when operating in the second mode, and wherein the control unit is further configured to adjust an amount of delay provided by the delay unit when operating in the first mode.

2. The apparatus as recited in claim 1, further comprising a transition unit coupled to generate and convey the signal to the delay unit, wherein the transition unit is configured to provide the signal to the delay unit when operating in the second mode.

3. The apparatus as recited in claim 2, wherein the transition unit is configured to periodically repeat providing the signal to the delay unit when operating in the second mode.

4. The apparatus as recited in claim 1, wherein the calibration unit includes a feedback path coupled between an output and an input of the delay unit such that a ring oscillator is formed when the feedback path is enabled, and wherein the calibration unit further includes a counter coupled to the feedback path, wherein the counter is configured to count a number of cycles of operation of the ring oscillator when the apparatus is operating in the first mode.

5. A method comprising:
   calibrating a delay line to provide a delay within a predetermined delay range when operating a built-in-self test (BIST) circuit in a calibration mode;
   switching the BIST circuit from the calibration mode to a normal mode;
   periodically providing one of a first plurality of logic signals to the delay line when in the normal mode, wherein the delay line is configured to output a second plurality of logic signals each based on a corresponding one of the first plurality of logic signals;
   comparing each of the plurality of first logic signals to corresponding ones of the second logic signals; and
   generating an error indication if one of the plurality of first logic signals has a logic level different from its corresponding one of the plurality of second logic signals.

6. The method as recited in claim 5, wherein said calibrating the delay line includes:
   enabling a feedback path coupled between an output of the delay line and an input of the delay line, wherein said enabling the feedback path forms a ring oscillator;
   counting a number of transitions caused by the ring oscillator during a predetermined time period;
   determining if the number of transitions is within a specified range;

adjusting an amount of delay provided by the delay line and repeating said counting and said determining if the number of transitions is not within the specified range; and disabling the feedback path if the number of transitions is within the specified range.

7. The method as recited in claim 5, wherein said adjusting an amount of delay comprises changing a number of delay elements enabled in the delay line.

8. The method as recited in claim 5, further comprising a transition circuit serially providing the first plurality of logic signals to the delay line, and further comprising the transition circuit providing consecutive ones of the first plurality of logic signals in opposite logic states with respect to one another.

9. The method as recited in claim 5, further comprising tracking a count of error indications generated by said comparing.

10. A circuit comprising:
an inverting delay chain;
a feedback loop coupled between an output of the delay chain and a first input of the delay chain, wherein feedback loop and the delay chain form a ring oscillator when the circuit is operating in a calibration mode;
a transition circuit coupled to a second input of the delay chain, wherein the transition circuit is configured to launch logical transitions into the delay chain when operating in a normal mode;
a first counter coupled to the feedback loop, wherein the first counter is configured to count transitions in the ring oscillator when operating in the calibration mode;
a compare circuit coupled to the transition circuit and an output of the delay chain, wherein the compare circuit is configured to, when operating in the normal mode, compare expected data resulting from a logical transition launched by the transition circuit to received data provided from the delay chain, and further configured provide an indication if a mismatch is detected.

11. The circuit as recited in claim 10, further comprising a control circuit, wherein the control circuit is configured to enable to the feedback loop and disable the transition circuit for operation in the calibration mode, and wherein the control circuit is further configured to disable the feedback loop and enable the transition circuit for operation in the normal mode.

12. The circuit as recited in claim 11, wherein a delay provided by the delay line is selectable, and wherein the control circuit is configured to adjust the delay when operating in the calibration mode.

13. The circuit as recited in claim 11, wherein the control unit is configured to disable the feedback loop responsive to determining that a number of transitions of the ring oscillator within a predetermined time is within a specified range.

14. The circuit as recited in claim 10, wherein the circuit further includes a second counter coupled to the compare circuit, wherein the second counter is configured to maintain a count of a number of error indications received.

15. An integrated circuit comprising:
a plurality of power domains, wherein each of the plurality of power domains is coupled to receive a supply voltage independent of the other ones of the plurality of power domains, and wherein each of the plurality of power domains includes a built-in-self test (BIST) circuit comprising:
a delay circuit coupled to receive a first signal and configured to output, after a delay time, a second signal based on the first signal;
a calibration circuit configured to, when the BIST circuit is operating in a calibration mode, determine an amount of delay time provided by the delay circuit; and
a comparator coupled to receive the first signal and the second signal, wherein the comparator is configured to, when the BIST circuit is operating in a normal mode, compare the second signal to a complement of the first signal, and wherein the comparator is further configured to generate an error indication if a logic level of the complement of the first signal is not equivalent to a logic level of the second signal.

16. The integrated circuit as recited in claim 15, wherein the BIST circuit in each of the plurality of power domains further includes a transition circuit configured to launch logical transitions into the delay chain when operating in the normal mode.

17. The integrated circuit as recited in claim 15, wherein the calibration circuit of each BIST circuit includes a feedback loop having an input coupled to an output of the delay circuit, and an output coupled to the input of the delay circuit, wherein the feedback loop and the delay circuit form a ring oscillator when the feedback loop is enabled, and wherein the BIST circuit is configured to enable the feedback loop when operating in the calibration mode and is further configured to disable the feedback loop when operating in the normal mode.

18. The integrated circuit as recited in claim 17, wherein the calibration circuit of each BIST circuit includes a counter coupled to the feedback loop, wherein the counter is configured to count a number of transitions of the output of the delay circuit within a predetermined time when operating in the calibration mode.

19. The integrated circuit as recited in claim 15, wherein the BIST circuit of each of the plurality of power domains further includes a capture circuit coupled to the comparator, wherein the capture circuit is configured to record the error indication, and wherein the capture circuit is coupled to convey a corresponding indication to a cycle logger configured to record a cycle in which the error indication was asserted.

20. A method comprising:
initiating a startup routine for an integrated circuit;
operating a built-in self-test (BIST) circuit in a calibration mode during execution of the startup routine, wherein operation in the calibration mode includes calibrating a delay of a delay unit to within a specified range;
exiting the calibration mode and entering a normal mode upon completing said calibrating;
launching logical transitions from a transition circuit into the delay unit while operating in the normal mode;
comparing a logic level of a first signal to a logic level of a second signal, wherein the first signal is based on a logical transition generated by the transition circuit and wherein the second signal is based on a signal output by the delay unit; and
generating an error indication if the logic levels of the first and second signals are not equivalent to one another.

21. The method as recited in claim 20, wherein said calibrating the delay of the delay unit comprises:
enabling a feedback path coupled between an output of the delay unit and an input of the delay unit, wherein the delay unit and the feedback path form a ring oscillator when the feedback path is enabled;
counting a number of transitions caused by the ring oscillator during a specified amount of time;
determining if the number of transitions is within a specified range;

if the number of transitions is not within a specified range, changing a number of active delay elements in the delay unit and repeating said counting and said determining; and disabling the feedback path if the number of transitions is within the specified range.

22. The method as recited in claim 20, wherein said launching logical transitions comprises the transition circuit sequentially providing a plurality of logic signals to the delay unit, wherein each of the plurality of logic signals is a logical complement of an immediately preceding one of the plurality of logic signals.

23. The method as recited in claim 20, further comprising inhibiting the transition circuit from launching logical transitions when operating in the calibration mode.

24. The method as recited in claim 20, further comprising counting a number of error indications generated based on multiple instances of said comparing.

* * * * *